(12) United States Patent
Park et al.

(10) Patent No.: US 10,074,751 B2
(45) Date of Patent: Sep. 11, 2018

(54) SOLAR CELL AND METHOD OF FABRICATING THE SAME

(71) Applicant: INDUSTRY-UNIVERSITY COOPERATION FOUNDATION HANYANG UNIVERSITY ERICA CAMPUS, Gyeonggi-do (KR)

(72) Inventors: Tae Joo Park, Gwangju (KR); Dae Woong Kim, Gyeonggi-do (KR)

(73) Assignee: INDUSTRY-UNIVERSITY COOPERATION FOUNDATION HANYANG UNIVERSITY ERICA CAMPUS, Ansan-si (KR)

( * ) Notice: Subject to any disclaimer, the term of this patent is extended or adjusted under 35 U.S.C. 154(b) by 0 days.

(21) Appl. No.: 14/881,391

(22) Filed: Oct. 13, 2015

(65) Prior Publication Data

US 2016/0104811 A1 Apr. 14, 2016

(30) Foreign Application Priority Data

Oct. 13, 2014 (KR) ........................ 10-2014-0137690

(51) Int. Cl.
| | | |
|---|---|---|
| H01L 31/0216 | (2014.01) | |
| H01L 31/0236 | (2006.01) | |
| H01L 31/068 | (2012.01) | |
| H02S 10/00 | (2014.01) | |

(52) U.S. Cl.
CPC .. *H01L 31/02168* (2013.01); *H01L 31/02167* (2013.01); *H01L 31/02366* (2013.01); *H01L 31/068* (2013.01); *H02S 10/00* (2013.01); *Y02E 10/547* (2013.01)

(58) Field of Classification Search
CPC ................................................ H01L 31/02168
See application file for complete search history.

(56) References Cited

U.S. PATENT DOCUMENTS

| | | | | |
|---|---|---|---|---|
| 2011/0240114 A1* | 10/2011 | Stewart | ............. | H01L 31/02167 136/256 |
| 2012/0216857 A1 | 8/2012 | Tsai et al. | | |
| 2012/0291863 A1* | 11/2012 | Suh | .................... | H01L 31/02167 136/256 |
| 2013/0068286 A1* | 3/2013 | Wang | .............. | H01L 31/035227 136/249 |
| 2013/0186464 A1* | 7/2013 | Sheng | ................... | H01L 31/068 136/256 |
| 2013/0255777 A1* | 10/2013 | Lee | ................... | H01L 31/02167 136/259 |

FOREIGN PATENT DOCUMENTS

| | | |
|---|---|---|
| JP | 2014-075440 | 4/2014 |
| KR | 10-2012-0084104 | 7/2012 |
| KR | 10-2012-0135325 | 11/2012 |
| KR | 10-2013-0102173 | 9/2013 |
| KR | 10-2014-0003802 | 1/2014 |

\* cited by examiner

*Primary Examiner* — Devina Pillay
*Assistant Examiner* — Daniel P Malley, Sr.
(74) *Attorney, Agent, or Firm* — Finch & Maloney PLLC

(57) ABSTRACT

A solar cell is provided. The solar cell includes a first semiconductor layer of a first conductivity type, a second semiconductor layer of a second conductivity type disposed on the first semiconductor layer, an anti-reflection layer on the second semiconductor layer, and a negative charge layer between the anti-reflection layer and the second semiconductor layer.

15 Claims, 12 Drawing Sheets

SOLAR CELL AND METHOD OF FABRICATING THE SAME

THE NAMES OF THE PARTEIS TO A JOINT RESEARCH AGREEMENT

This work was supported by the Future Semiconductor Device Technology Development Program (Grant 10067739) funded by MOTIE (Ministry of Trade, Industry & Energy) and KSRC (Korea Semiconductor Research Consortium). This work was also supported by the National Research Foundation of Korea (NRF) grant funded by the Korean government (MSIT) (No. 2015R1A5A1037548).

CROSS-REFERENCE TO RELATED APPLICATION

This U.S. non-provisional patent application claims priority under 35 U.S.C. § 119 to Korean Patent Application No. 10-2014-0137690, filed on Oct. 13, 2014, in the Korean Intellectual Property Office, the disclosure of which is hereby incorporated by reference in its entirety.

BACKGROUND

The inventive concepts relate to a solar cell and a method of fabricating the same and, more particularly, to a solar cell including a negative charge layer and a method of fabricating the same.

A solar cell is a photovoltaic energy conversion system that converts solar energy outputted from the sun into electrical energy. Various kinds of solar cells (e.g., silicon solar cells, dye-sensitized solar cells, quantum dot-sensitized solar cells, and solar cells including copper-indium-gallium-selenium (CIGS)-based materials) have been developed to improve photovoltaic conversion efficiency.

For example, Korean Patent Publication No. 10-2013-0102667 (Korean patent application No. 10-2012-0023636) discloses a dye-sensitized solar cell that uses a semiconductor electrode layer including metal oxide nanotubes containing metal nanoparticles. In addition, Korean Patent Registration No. 10-1294935 discloses a quantum dot-sensitized solar cell that includes a metal oxide layer having a plurality of protrusions formed at predetermined intervals to improve photovoltaic conversion efficiency.

Meanwhile, the silicon solar cell uses a P—N junction diode and generates electrical power by exciting electrons using photons having energy equal to or greater than band-gap energy.

The silicon solar cell may have the photovoltaic conversion efficiency of 25% or less, so silicon solar cells capable of improving the photovoltaic conversion efficiency should be developed to use the silicon solar cells in earnest.

SUMMARY

Embodiments of the inventive concepts may provide a solar cell with high efficiency and high reliability and a method of fabricating the same.

Embodiments of the inventive concepts may also provide a solar cell with improved photovoltaic conversion efficiency and a method of fabricating the same.

Embodiments of the inventive concepts may also provide a solar cell capable of easily using general fabrication equipment and a method of fabricating the same.

In one aspect, a solar cell may include a first semiconductor layer of a first conductivity type, a second semiconductor layer of a second conductivity type disposed on the first semiconductor layer, an anti-reflection layer on the second semiconductor layer, and a negative charge layer between the anti-reflection layer and the second semiconductor layer.

In an embodiment, the negative charge layer may include at least one of chalcogen elements.

In an embodiment, a thickness of the negative charge layer may be smaller than a thickness of the anti-reflection layer.

In an embodiment, the negative charge layer may be disposed directly on the second semiconductor layer so as to be in contact with the second semiconductor layer.

In an embodiment, each of the second semiconductor layer, the negative charge layer and the anti-reflection layer may have an uneven structure including at least one concave portion and at least one convex portion.

In an embodiment, the solar cell may further include an electrode pattern penetrating the anti-reflection layer so as to be in contact with the negative charge layer.

In an embodiment, the negative charge layer may include a compound including a first element and a chalcogen element, and the first element may be the same as one of elements constituting the anti-reflection layer.

In another aspect, a method of fabricating a solar cell may include preparing a first semiconductor layer of a first conductivity type and a second semiconductor layer of a second conductivity type disposed on the first semiconductor layer, forming an anti-reflection layer on the second semiconductor layer, and forming a negative charge layer on the second semiconductor layer. The negative charge layer may be provided between the second semiconductor layer and the anti-reflection layer.

In an embodiment, the negative charge layer may be formed after forming the anti-reflection layer.

In an embodiment, forming the negative charge layer may include thermally treating or plasma-treating the anti-reflection layer using a source including a chalcogen element.

In an embodiment, the negative charge layer may be formed before forming the anti-reflection layer. In this case, forming the negative charge layer may include at least one of thermally treating the second semiconductor layer using a source including a chalcogen element, plasma-treating the second semiconductor layer using a source including the chalcogen element, providing a solution including the chalcogen element to the second semiconductor layer, or performing an atomic layer deposition (ALD) method using a source including the chalcogen element on the second semiconductor layer.

In an embodiment, thermally treating using the source including the chalcogen element may be performed at a temperature of 550 degrees Celsius to 700 degrees Celsius.

In an embodiment, forming the negative charge layer may include providing a first source including a first element, a second source including a second element and a third source including a chalcogen element to a top surface of the second semiconductor layer.

In an embodiment, forming the anti-reflection layer may include providing the first source and the second source to a top surface of the negative charge layer.

In an embodiment, forming the negative charge layer may include providing a first source including a first element and a third source including a chalcogen element to a top surface of the second semiconductor layer.

In an embodiment, forming the anti-reflection layer may include providing the first source and a second source including a second element to a top surface of the negative charge layer.

In still another aspect, a solar cell may include a semiconductor layer, an electrode on the semiconductor layer, a passivation layer between the semiconductor layer and the electrode, and a negative charge layer between the passivation layer and the semiconductor layer.

BRIEF DESCRIPTION OF THE DRAWINGS

The inventive concepts will become more apparent in view of the attached drawings and accompanying detailed description.

DETAILED DESCRIPTION OF THE EMBODIMENTS

Figure 1A:
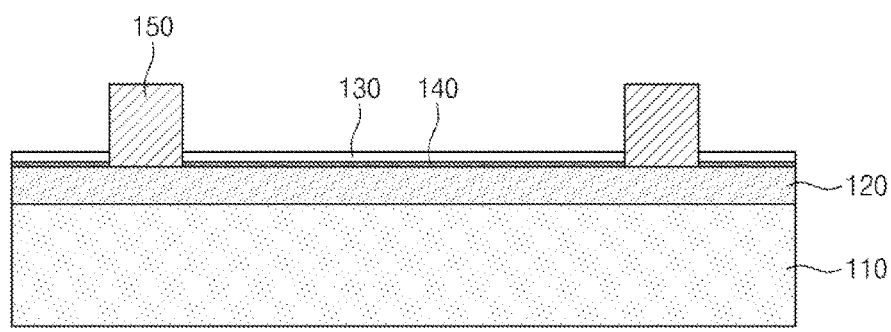
FIG. 1A is a cross-sectional view illustrating a solar cell according to a first embodiment of the inventive concepts.

The inventive concepts will now be described more fully hereinafter with reference to the accompanying drawings, in which exemplary embodiments of the inventive concepts are shown. The advantages and features of the inventive concepts and methods of achieving them will be apparent from the following exemplary embodiments that will be described in more detail with reference to the accompanying drawings. It should be noted, however, that the inventive concepts are not limited to the following exemplary embodiments, and may be implemented in various forms. Accordingly, the exemplary embodiments are provided only to disclose the inventive concepts and let those skilled in the art know the category of the inventive concepts. In the drawings, embodiments of the inventive concepts are not limited to the specific examples provided herein and are exaggerated for clarity.

It will be understood that when an element such as a layer, region or substrate is referred to as being "on" another element, it can be directly on the other element or intervening elements may be present. In contrast, the term "directly" means that there are no intervening elements. In the drawings, the thicknesses of layers and regions are exaggerated for clarity.

It will be also understood that although the terms first, second, third etc. may be used herein to describe various elements, these elements should not be limited by these terms. These terms are only used to distinguish one element from another element. Thus, a first element in some embodiments could be termed a second element in other embodiments without departing from the teachings of the present invention. Exemplary embodiments of aspects of the present inventive concepts explained and illustrated herein include their complementary counterparts. The same reference numerals or the same reference designators denote the same elements throughout the specification. As used herein, the term "and/or" includes any and all combinations of one or more of the associated listed items.

The terminology used herein is for the purpose of describing particular embodiments only and is not intended to limit the invention. As used herein, the singular terms "a," "an" and "the" are intended to include the plural forms as well, unless the context clearly indicates otherwise. It will be understood that when an element is referred to as being "connected" or "coupled" to another element, it may be directly connected or coupled to the other element or intervening elements may be present. It will be further understood that the terms "comprises", "comprising,", "includes" and/or "including", when used herein, specify the presence of stated features, integers, steps, operations, elements, and/or components, but do not preclude the presence or addition of one or more other features, integers, steps, operations, elements, components, and/or groups thereof.

In addition, in explanation of the present invention, the descriptions to the elements and functions of related arts may be omitted if they obscure the subjects of the present invention.

FIG. 1A is a cross-sectional view illustrating a solar cell according to a first embodiment of the inventive concepts.

Referring to FIG. 1A, a solar cell according to a first embodiment of the inventive concepts may include a first semiconductor layer 110, a second semiconductor layer 120, an anti-reflection layer 130, a negative charge layer 140, and an electrode 150.

The first semiconductor layer 110 may be a crystalline or amorphous silicon layer. The first semiconductor layer 110 may be doped with dopants of a first conductivity type. According to an embodiment, the first semiconductor layer 110 may be a P-type semiconductor layer.

The second semiconductor layer 120 may be disposed on the first semiconductor layer 110. The second semiconductor layer 120 may be a crystalline or amorphous silicon layer.

The second semiconductor layer 120 may be doped with dopants of a second conductivity type. According to an embodiment, the second semiconductor layer 120 may be an N-type semiconductor layer.

A thickness of the first semiconductor layer 110 may be thicker than a thickness of the second semiconductor layer 120. Thus, a possibility of capturing photons inputted from the outside may be improved to improve the photovoltaic conversion efficiency of the solar cell.

The first semiconductor layer 110 may have a first surface on which the second semiconductor layer 120 is provided, and a second surface opposite to the first surface. Even though not shown in FIG. 1A, an additional electrode may be provided on the second surface of the first semiconductor layer 110.

The anti-reflection layer 130 may be disposed on the second semiconductor layer 120. The anti-reflection layer 130 may minimize reflection of light inputted from the outside. The anti-reflection layer 130 may be formed of a material of which a refractive index is lower than that of the first semiconductor layer 110 and/or that of the second semiconductor layer 120. For example, when the first and second semiconductor layers 110 and 120 are formed of silicon as described above, the anti-reflection layer 130 may be formed of a material having a refractive index lower than the refractive index (i.e., 3.8) of silicon.

According to an embodiment, the anti-reflection layer 130 may be formed of aluminum oxide (e.g., $Al_2O_3$). Alternatively, the anti-reflection layer 130 may include at least one of silicon oxide (e.g., $SiO_2$), silicon nitride (e.g., SiN or $Si_3N_4$), a metal oxide (e.g., MgO or $TiO_2$), or a metal sulfide.

The negative charge layer 140 may be disposed between the anti-reflection layer 130 and the second semiconductor layer 120. The negative charge layer 140 may have fixed negative charges. The negative charge layer 140 may include at least one of chalcogen elements. According to an embodiment, the negative charge layer 140 may include sulfur (S). In an embodiment, a thickness of the negative charge layer 140 may be smaller than a thickness of the anti-reflection layer 130.

According to an embodiment, the negative charge layer 140 may be formed of a compound including a first element the chalcogen element. Here, the first element is the same as one of elements constituting the anti-reflection layer 130. For example, when the anti-reflection layer 130 is formed of aluminum oxide (e.g., $Al_2O_3$) as described above, the negative charge layer 140 may be formed of aluminum sulfide (e.g., AlS). Alternatively, according to another embodiment, the negative charge layer 140 may be formed of a compound including a first element, a second element, and the chalcogen element. Here, the first element and the second element may be the same as elements constituting the anti-reflection layer 130. For example, when the anti-reflection layer 130 is formed of aluminum oxide (e.g., $Al_2O_3$) as described above, the negative charge layer 140 may be formed of aluminum oxysulfide (e.g., AlOS).

The electrode 150 may penetrate the anti-reflection layer 130 and the negative charge layer 140 so as to be in contact with the second semiconductor layer 120. In an embodiment, a bottom surface of the electrode 150 may be in contact with the second semiconductor layer 120, and a sidewall of the electrode 150 may be in contact with the negative charge layer 140.

According to an embodiment of the inventive concepts, the negative charge layer 140 having the negative charges may be disposed between the second semiconductor layer 120 and the anti-reflection layer 130. Electrons excited by external light may be effectively moved into the electrode 150 by the negative charges included in the negative charge layer 140. In addition, an interface defect density between the second semiconductor layer 120 and the anti-reflection layer 130 may be reduced by the negative charge layer 140.

If the negative charge layer 140 according to an embodiment of the inventive concepts is omitted and the second semiconductor layer 120 includes silicon, oxygen may be combined with silicon included in the second semiconductor layer 120 to generate silicon oxide (e.g., a natural oxide layer) between the second semiconductor layer 120 and the anti-reflection layer 130. The silicon oxide generated between the second semiconductor layer 120 and the anti-reflection layer 130 may have positive charges. Thus, electrons excited by the external light may be captured by the positive charges of the silicon oxide and may not be easily moved to the electrode 150. This means that the photovoltaic conversion efficiency of a solar cell may be reduced.

In addition, since the negative charge layer 140 is omitted, the second semiconductor layer 120 may be in direct contact with the anti-reflection layer 130. Thus, an interface defect density between the second semiconductor layer 120 and the anti-reflection layer 130 may be increased.

However, as described above, in the embodiment of the inventive concepts, the negative charge layer 140 may be provided between the second semiconductor layer 120 and the anti-reflection layer 130. Thus, the electrons may be easily moved to the electrode 150, and the interface defect density between the second semiconductor layer 120 and the anti-reflection layer 130 may be reduced. As a result, it is possible to provide the high-efficient and high-reliable solar cell having the improved photovoltaic conversion efficiency.

Unlike the first embodiment of the inventive concepts described above, the electrode 150 may be disposed on the negative charge layer 140 in a modified embodiment of the first embodiment of the inventive concepts. This will be described with reference to FIG. 1B.

Figure 1B:
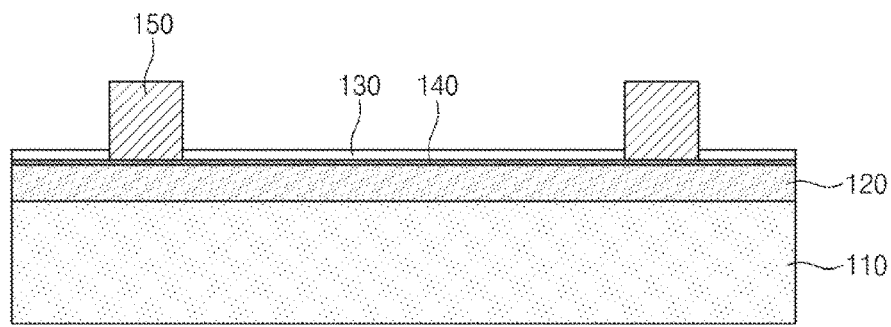
FIG. 1B is a cross-sectional view illustrating a solar cell according to a modified embodiment of a first embodiment of the inventive concepts.

FIG. 1B is a cross-sectional view illustrating a solar cell according to a modified embodiment of a first embodiment of the inventive concepts.

Referring to FIG. 1B, the first semiconductor layer 110, the second semiconductor layer 120, the anti-reflection layer 130, and the negative charge layer 140, described in FIG. 1A, may be provided. Unlike FIG. 1A, the electrode 150 may penetrate the anti-reflection layer 130 so as to be in contact with the negative charge layer 140. In other word, the negative charge layer 140 may be disposed between the electrode 150 and the second semiconductor layer 120, and the electrode 151) may be spaced apart from the second semiconductor layer 120.

Unlike the first embodiment and the modified embodiment described above, a second semiconductor layer, a negative charge layer, and an anti-reflection layer may have uneven structures having concave portions and convex portions in a second embodiment of the inventive concepts. These will be described with reference to FIG. 2.

Figure 2:
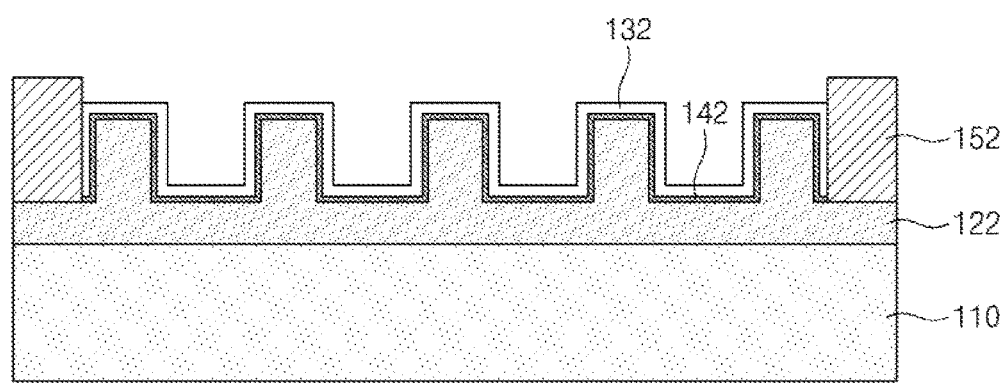
FIG. 2 is a cross-sectional view illustrating a solar cell according to a second embodiment of the inventive concepts.

FIG. 2 is a cross-sectional view illustrating a solar cell according to a second embodiment of the inventive concepts.

Referring to FIG. 2, a solar cell according to a second embodiment of the inventive concepts may include a first semiconductor layer 110, a second semiconductor layer 122, an anti-reflection layer 132, a negative charge layer 142, and an electrode 152.

The first semiconductor layer 110 may correspond to the first semiconductor layer 110 described with reference to FIG. 1A.

The second semiconductor layer 122 may be disposed on the first semiconductor layer 110. A top surface of the second semiconductor layer 122 may be textured to have an uneven structure having at least one concave portion and at least one convex portion. The second semiconductor layer 122 may be a crystalline or amorphous silicon layer. The second semiconductor layer 122 may be doped with dopants of a second conductivity type. In an embodiment, the second semiconductor layer 122 may be an N-type semiconductor layer.

The anti-reflection layer 132 may be disposed on the second semiconductor layer 122. The anti-reflection layer 132 may have an uneven structure having at least one concave portion and at least one convex portion. The anti-reflection layer 132 may be formed of the same material as the anti-reflection layer 130 described with reference to FIG. 1A.

The negative charge layer 142 may be disposed between the second semiconductor layer 122 and the anti-reflection layer 132. The negative charge layer 142 may extend along a profile of the top surface of the second semiconductor layer 122 to have an uneven structure having at least one concave portion and at least one convex portion. The negative charge layer 142 may be formed of the same material as the negative charge layer 140 described with reference to FIG. 1A.

According to an embodiment of the inventive concepts, external light may be effectively incident on the first semiconductor layer 110 and the second semiconductor layer 122 by the anti-reflection layer 132, the negative charge layer 142 and the second semiconductor layer 122 which have the uneven structures, and thus, the photovoltaic conversion efficiency of the solar cell may be improved.

Methods of fabricating the solar cell including the negative charge layer according to the aforementioned embodiments of the inventive concepts will be described with reference to FIGS. 3 and 4.

Figure 3:
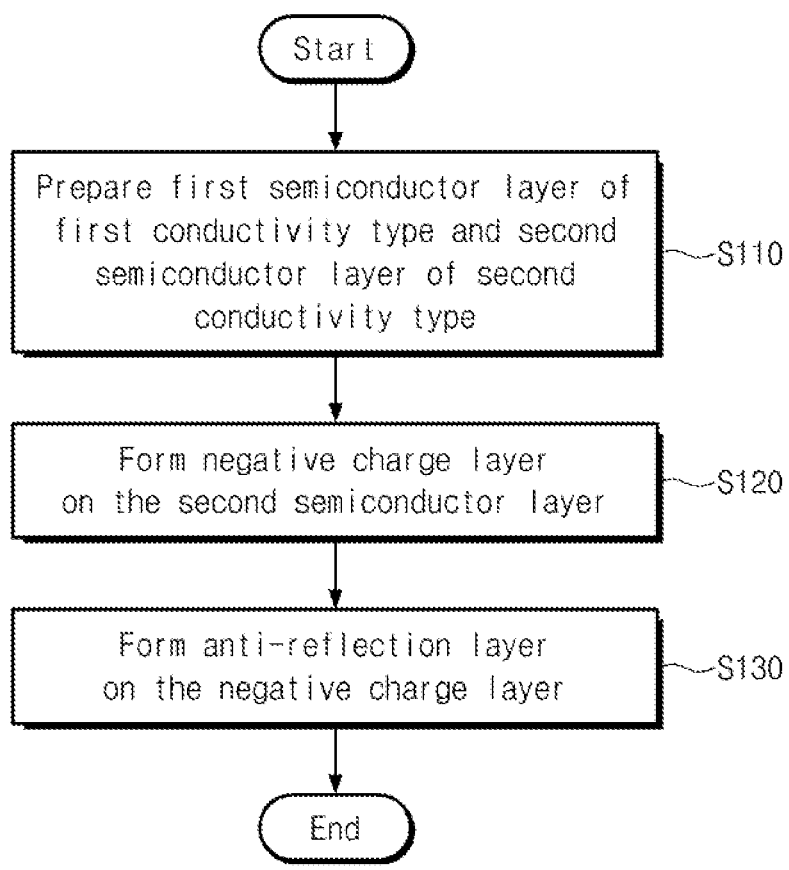
FIG. 3 is a flow chart illustrating a method of fabricating a solar cell in accordance with a first embodiment of the inventive concepts.

FIG. 3 is a flow chart illustrating a method of fabricating a solar cell in accordance with a first embodiment of the inventive concepts.

Referring to FIG. 3, a first semiconductor layer of a first conductivity type and a second semiconductor layer of a second conductivity type are prepared (S110). The second semiconductor layer may be disposed on the first semiconductor layer. Each of the first and second semiconductor layers may be a crystalline and/or amorphous silicon layer. For example, preparing the first semiconductor layer and the second semiconductor layer (SI 10) may include preparing a semiconductor layer of the first conductivity type, and doping an upper portion of the semiconductor layer of the first conductivity type with dopants of the second conductivity type to form the first semiconductor layer of the first conductivity type and the second semiconductor layer of the second conductivity type.

A negative charge layer may be formed on the second semiconductor layer (S120). According to an embodiment, forming the negative charge layer may include thermally treating the second semiconductor layer using a source including a chalcogen element. For example, the second semiconductor layer may be thermally treated in a sulfur atmosphere using a $H_2S$ gas or powder including sulfur, thereby forming the negative charge layer. If a temperature of the thermal treatment is lower than 550 degrees Celsius, the negative charge layer may not be easily generated. In addition, if the temperature of the thermal treatment is higher than 700 degrees Celsius, silicon included in the second semiconductor layer may be thermally oxidized to form silicon oxide. In this case, the photovoltaic conversion efficiency of a solar cell may be reduced by positive charges of the silicon oxide. Thus, the temperature of the thermal treatment according to embodiments of the inventive concepts may range from 550 degrees Celsius to 700 degrees Celsius.

In another embodiment, forming the negative charge layer may include providing a solution including the chalcogen element to the second semiconductor layer. For example, the solution including $(NH_4)_2S$ and/or $Na_2S$ may be provided to the second semiconductor layer to form the negative charge layer. In still another embodiment, forming the negative charge layer may include plasma-treating the second semiconductor layer using a source including the chalcogen element. In yet another embodiment, the negative charge layer may be deposited on the second semiconductor layer by an atomic layer deposition (ALD) or plasma ALD method using a source including the chalcogen element.

After the formation of the negative charge layer, an anti-reflection layer may be formed on the negative charge layer (S130). In an embodiment, the anti-reflection layer may be formed by an ALD or plasma ALD method. For example, the anti-reflection layer may be formed by the ALD or plasma ALD method using a source including aluminum (e.g., TMA) and a source including oxygen.

According to an embodiment, the anti-reflection layer may be formed using the same source as at least one of sources used to form the negative charge layer. For example, when the negative charge layer includes aluminum oxysulfide (e.g., AlOS) formed by an ALD or plasma ALD method using a first source (e.g., TMA) including a first element (e g., aluminum), a second source including a second element (e.g., oxygen) and a third source (e.g. $H_2S$) including the chalcogen element (e.g., sulfur), the anti-reflection layer may include aluminum oxide (e.g., $Al_2O_3$) formed by an ALD or plasma ALD method using the first source (e.g., TMA) and the second source (e.g., an oxygen gas). Thus, the number of the sources necessary to form the negative charge layer and the anti-reflection layer may be reduced, so process efficiency may be improved and process costs may be reduced. Alternatively, when the negative charge layer includes aluminum sulfide (e.g., AlS) formed by an ALD or plasma ALD method using the first source (e.g., TMA) including the first element (e.g., aluminum) and the third source (e.g. $H_2S$) including the chalcogen element (e.g., sulfur), the anti-reflection layer may include aluminum oxide (e.g., $Al_2O_3$) formed by the ALD or plasma ALD method using the first source (e.g., TMA) and the second source (e.g., the oxygen gas).

Unlike the aforementioned method of fabricating the solar cell in accordance with the first embodiment of the inventive concepts, the negative charge layer may be formed after formation of the anti-reflection layer in a method of fabricating a solar cell in accordance with a second embodiment of the inventive concepts. This will be described with reference to FIG. 4.

Figure 4:
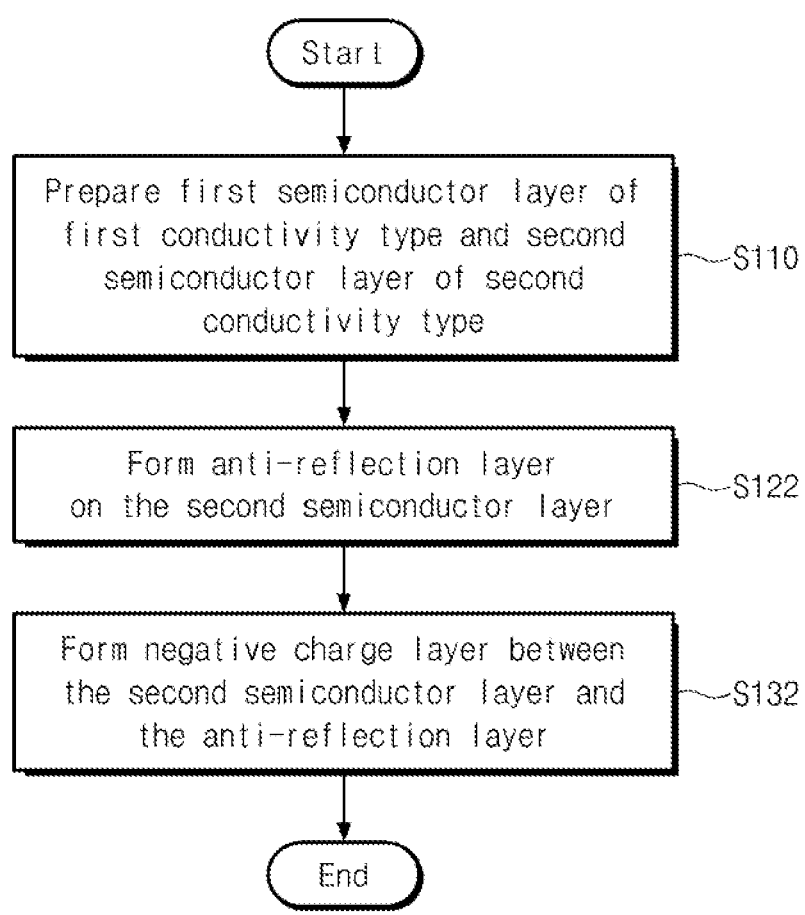
FIG. 4 is a flow chart illustrating a method of fabricating a solar cell in accordance with a second embodiment of the inventive concepts.

FIG. 4 is a flow chart illustrating a method of fabricating a solar cell in accordance with a second embodiment of the inventive concepts.

Referring to FIG. 4, a first semiconductor layer of a first conductivity type and a second semiconductor layer of a second conductivity type are prepared (S110), as described with reference to FIG. 3. The second semiconductor layer may be disposed on the first semiconductor layer.

An anti-reflection layer may be formed on the second semiconductor layer (S122). The anti-reflection layer may be formed by an ALD or plasma ALD method, as described with reference to FIG. 3.

After the formation of the anti-reflection layer, a negative charge layer may be formed between the anti-reflection layer and the second semiconductor layer (S132). In an embodiment, forming the negative charge layer may include thermally treating the anti-reflection layer using a source including a chalcogen element. Thus, the chalcogen element may permeate the anti-reflection layer so as to be provided to between the anti-reflection layer and the second semiconductor layer, and the negative charge layer including the chalcogen element may be formed between the anti-reflection layer and the second semiconductor layer. For example, if the anti-reflection layer is thermally treated in a sulfur atmosphere including a $H_2S$ gas or powder including sulfur, the sulfur may be provided to between the anti-reflection layer and the second semiconductor layer. Thus, the negative charge layer including the sulfur may be formed between the anti-reflection layer and the second semiconductor layer. As described with reference to FIG. 3, a temperature of the thermal treatment may range from 550 degrees Celsius to 700 degrees Celsius.

In another embodiment, forming the negative charge layer may include plasma-treating the anti-reflection layer using a source including the chalcogen element. Thus, the chalcogen element may permeate the anti-reflection layer so as to be provided to between the anti-reflection layer and the second semiconductor layer, and the negative charge layer including the chalcogen element may be formed between the anti-reflection layer and the second semiconductor layer.

Unlike the solar cells and the methods of fabricating the same according to the aforementioned embodiments of the inventive concepts, the negative charge layer may be provided to a metal-insulator-semiconductor (MIS)-type solar cell in a third embodiment of the inventive concepts. This will be described with reference to FIG. 5.

Figure 5:
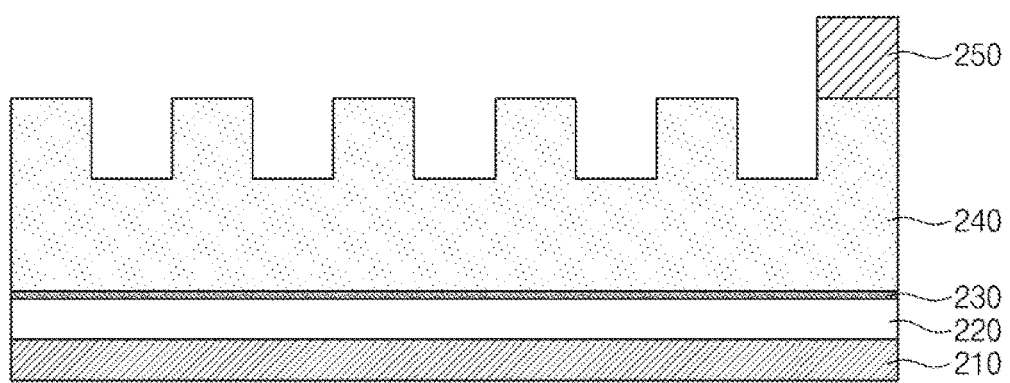
FIG. 5 is a cross-sectional view illustrating a solar cell according to a third embodiment of the inventive concepts and a method of fabricating the same.

FIG. 5 is a cross-sectional view illustrating a solar cell according to a third embodiment of the inventive concepts and a method of fabricating the same.

Referring to FIG. 5, a solar cell according to a third embodiment of the inventive concepts may include a first electrode 210, a passivation layer 220 on the first electrode 210, a negative charge layer 230 on the passivation layer 220, a semiconductor layer 240 on the negative charge layer 230, and a second electrode 250 on the semiconductor layer 240.

The first electrode 210 and the second electrode 250 may be formed of metal.

The passivation layer 220 may be formed of the same material as the anti-reflection layer described with reference to FIGS. 1A, 1B, 2, 3, and 4. For example, the passivation layer 220 may be formed of aluminum oxide.

The negative charge layer 230 may be formed of the same material as the negative charge layer described with reference to FIGS. 1A, 1B, 2, 3, and 4. In an embodiment, the negative charge layer 230 may include the chalcogen element. The negative charge layer 230 may be formed by the same method as the negative charge layer described with reference to FIGS. 1A, 1B, 2, 3, and 4. In some embodiments, after the formation of the passivation layer 220, the passivation layer 220 may be thermally treated or plasma-treated using a source including the chalcogen element to form the negative charge layer 230. In other embodiments, before the formation of the passivation layer 220, the negative charge layer 230 may be deposited on the semiconductor layer 240 by means of a source including the chalcogen element, a solution including the chalcogen element may be provided to the semiconductor layer 240 to form the negative charge layer 230, or the semiconductor layer 240 may be thermally treated or plasma-treated using a source including the chalcogen element to form the negative charge layer 230.

The semiconductor layer 240 may be an N-type or P-type semiconductor layer doped with N-type or P-type dopants. The semiconductor layer 240 may include a first surface adjacent to the negative charge layer 230, and a second surface adjacent to the second electrode 250. In an embodiment, the second surface of the semiconductor layer 240 may be textured to have an uneven structure having at least one concave portion and at least one convex portion. In an embodiment, a dopant concentration of a portion, adjacent to the first surface, of the semiconductor layer 240 may be different from that of another portion, adjacent to the second surface, of the semiconductor layer 240.

The solar cell according to the third embodiment of the inventive concepts may have a MIS structure by the first electrode 210, the passivation layer 220 and the semiconductor layer 240, and electrons may be easily moved to the first electrode 210 by the negative charge layer 230 provided between the passivation layer 220 and the semiconductor layer 240. Thus, a high-efficient and high-reliable solar cell may be realized.

Evaluation results of characteristics of the solar cell including the negative charge layer according to embodiments of the inventive concepts will be described hereinafter.

Figure 6:
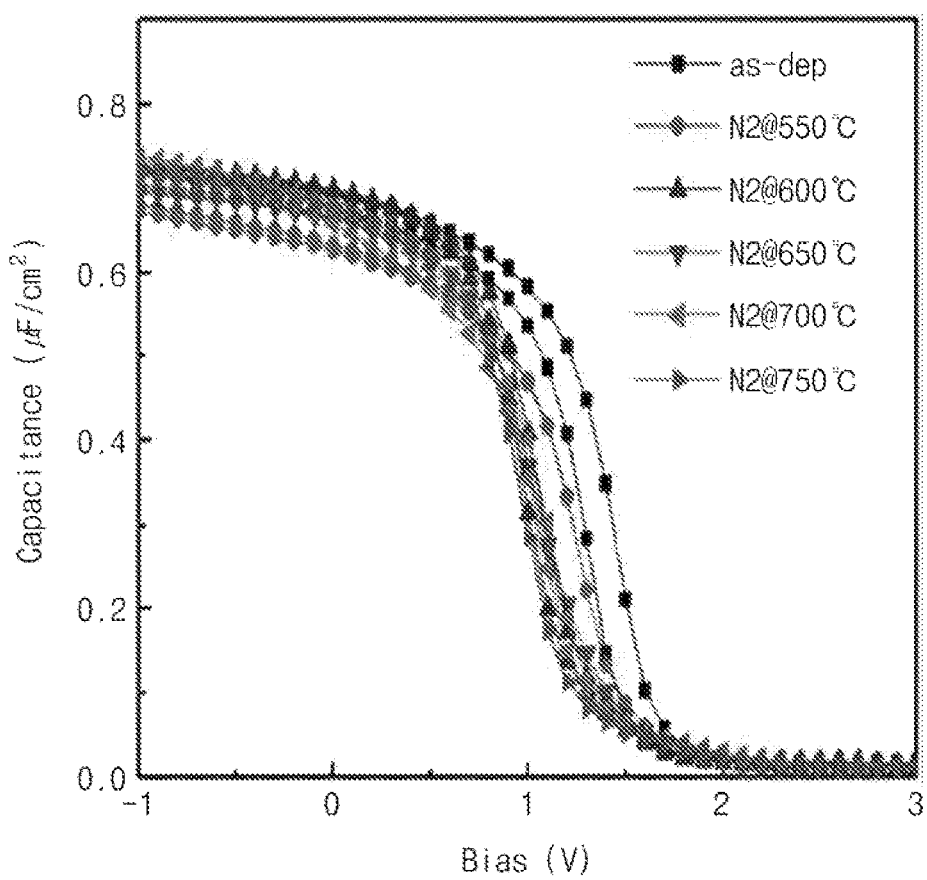
FIG. 6 is a graph showing capacitances measured according to a temperature of a thermal treatment in a $N_2$ gas atmosphere not including a chalcogen element in accordance with a comparison example to be compared with the embodiment of the inventive concepts.
Figure 7:
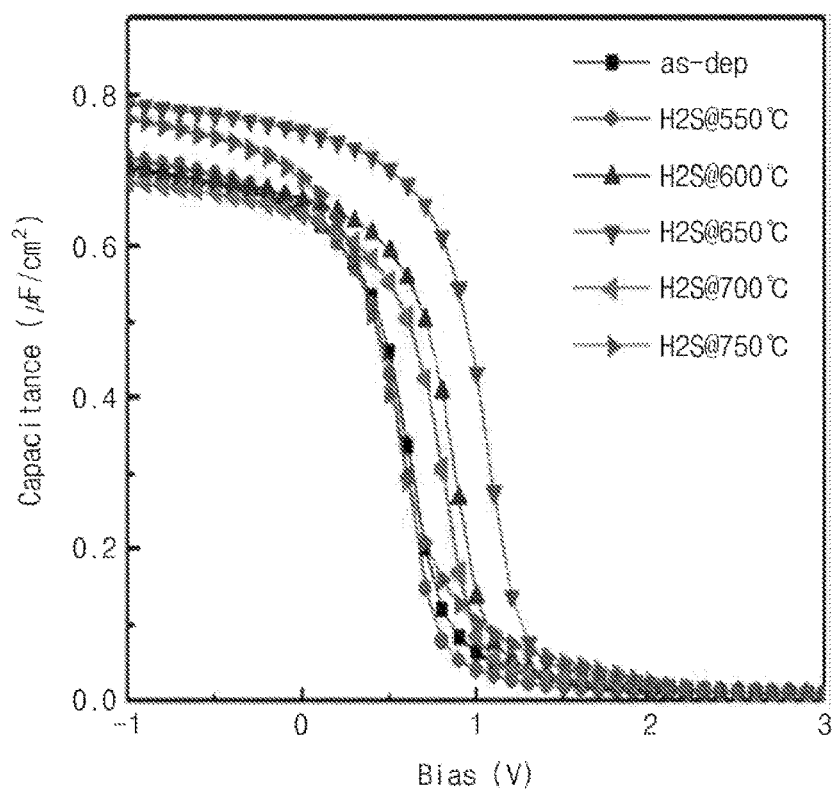
FIG. 7 is a graph showing capacitances measured according to a temperature of a thermal treatment using a chalcogen element in accordance with a method of fabricating a solar cell in embodiments of the inventive concepts.

FIG. 6 is a graph showing capacitances measured according to a temperature of a thermal treatment in a $N_2$ gas atmosphere not including a chalcogen element in accordance with a comparison example to be compared with the embodiment of the inventive concepts. FIG. 7 is a graph showing capacitances measured according to a temperature of a thermal treatment using a chalcogen element in accordance with a method of fabricating a solar cell in embodiments of the inventive concepts.

Referring to FIGS. 6 and 7, a P-type silicon layer was prepared as the first semiconductor layer, an N-type silicon layer was prepared as the second semiconductor layer, and an $Al_2O_3$ layer was prepared as the anti-reflection layer. FIG. 6 shows capacitances measured after thermal treatments were performed in a $N_2$ gas atmosphere not including a chalcogen element in accordance with the comparison example while varying a thermal treatment temperature. FIG. 7 shows capacitances measured after thermal treatments were performed in a $H_2S$ gas atmosphere including the chalcogen element (i.e., sulfur) according to the embodiment of the inventive concepts while varying a thermal treatment temperature, thereby forming negative charge layers.

In the cases that the thermal treatments are performed in the $N_2$ gas atmosphere according to the comparison example, a pattern of a graph according to the temperature shifts leftward as the temperature of the thermal treatment increases. In other word, silicon oxide is generated between the N-type silicon layer and the anti-reflection layer in the case that the temperature of the thermal treatment increases in the $N_2$ gas atmosphere.

On the contrary, in the cases that the thermal treatments are performed in the $H_2S$ gas atmosphere according to the embodiment of the inventive concepts, a pattern of a graph shifts rightward as the temperature of the thermal treatment increases and shifts leftward again when the temperature of the thermal treatment exceeds a specific temperature, as illustrated in FIG. 7. In other word, the negative charge layer including sulfur is generated as the temperature of the thermal treatment increases, but the effect obtained by the negative charge layer is reduced by silicon oxide having positive charges which is generated between the N-type silicon layer and the anti-reflection layer when the temperature of the thermal treatment exceeds a specific temperature (e.g., about 700 degrees Celsius). That is, when the negative charge layer is formed by the thermal treatment, the photovoltaic conversion efficiency of the solar cell depends on the temperature of the thermal treatment.

Figure 8:
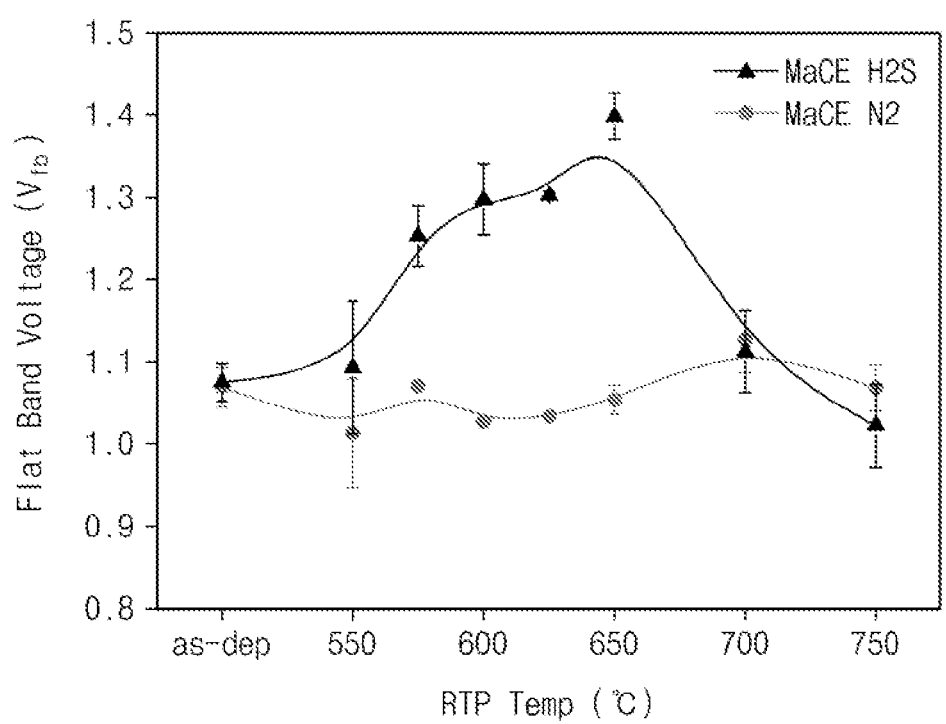
FIG. 8 is a graph showing flat band voltages measured according to temperatures of thermal treatments in accordance with a comparison example and an embodiment of the inventive concepts.

FIG. 8 is a graph showing flat band voltages measured according to temperatures of thermal treatments in accordance with a comparison example and an embodiment of the inventive concepts.

Referring to FIG. 8, flat band voltages ($V_{FB}$) were measured after the thermal treatments described with reference to FIGS. 6 and 7 were performed. The thermal treatment including sulfur according to the embodiment of the inventive concepts is performed to generate the negative charge layer, so the flat band voltage ($V_{FB}$) obtained according to the embodiment of the inventive concepts is increased compared with the flat band voltage ($V_{FB}$) obtained by performing the thermal treatment in the $N_2$ gas atmosphere not including the chalcogen element in accordance with the comparison example. In particular, the flat band voltage ($V_{FB}$) at the thermal treatment temperature of 550 degrees Celsius to 700 degrees Celsius is markedly improved compared with the flat band voltage ($V_{FB}$) at the thermal treatment temperature lower than 550 degrees Celsius and the flat band voltage ($V_{FB}$) at the thermal treatment temperature higher than 700 degrees Celsius.

Figure 9:
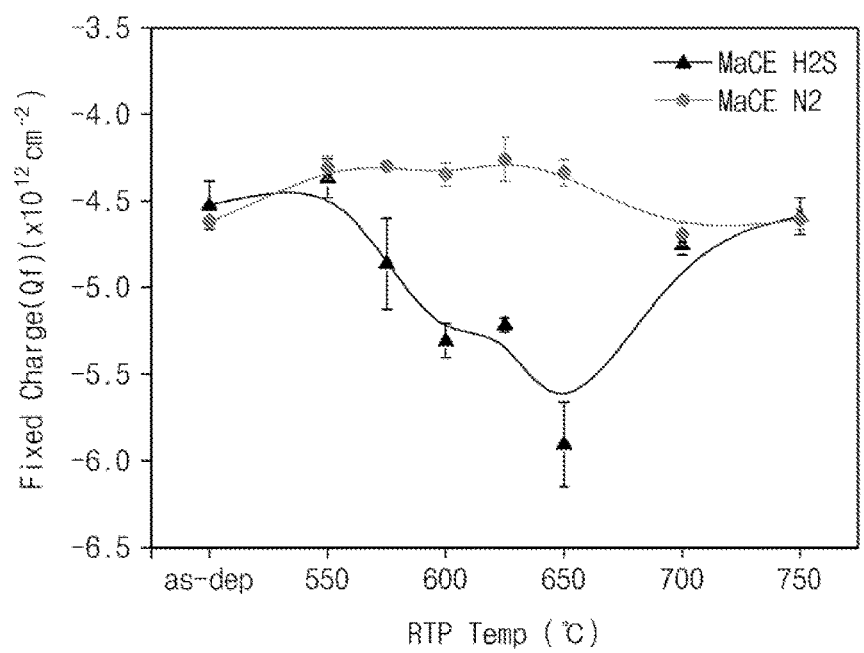
FIG. 9 is a graph showing fixed charges measured according to temperatures of thermal treatments in accordance with a comparison example and an embodiment of the inventive concepts.

FIG. 9 is a graph showing fixed charges measured according to temperatures of thermal treatments in accordance with a comparison example and an embodiment of the inventive concepts.

Referring to FIG. 9, fixed charges were measured after the thermal treatments described with reference to FIGS. 6 and 7 were performed. The thermal treatment including sulfur according to the embodiment of the inventive concepts is performed to generate the negative charge layer, so negative charges are generated, compared with performing the thermal treatment in the $N_2$ gas atmosphere not including the chalcogen element in accordance with the comparison example. In particular, the negative charges are effectively generated when the temperature of the thermal treatment is higher than 550 degrees Celsius. However, silicon oxide having positive charges is generated when the temperature of the thermal treatment is higher than 700 degrees Celsius, so the amount of the positive charges of the silicon oxide is greater than the amount of the negative charges of the negative charge layer. In other word, the negative charges may be effectively generated by performing the thermal treatment using the source including the chalcogen element at the temperature of 550 degrees Celsius to 700 degrees Celsius.

Figure 10:
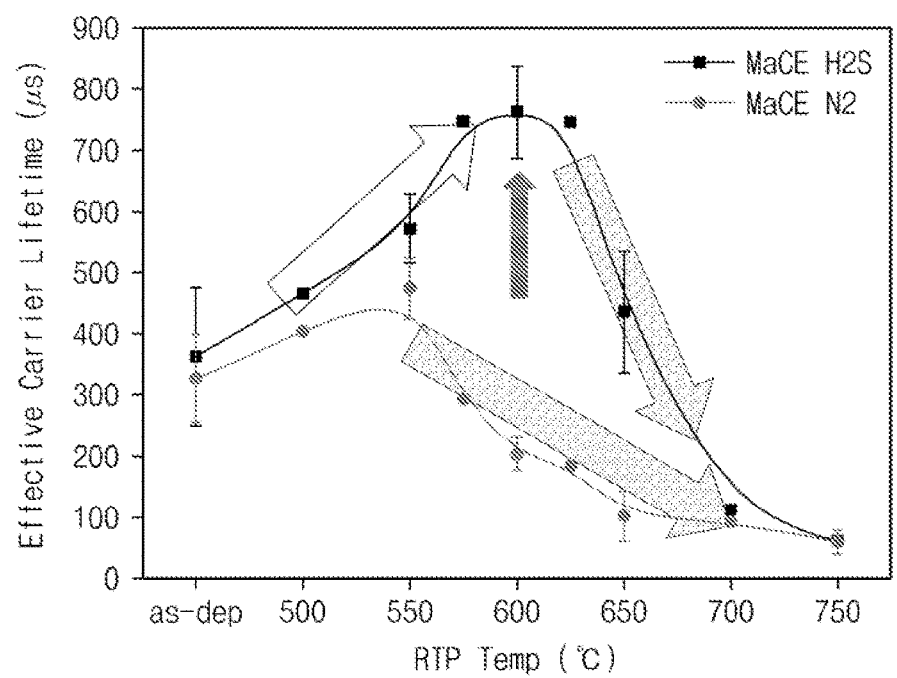
FIG. 10 is a graph showing effective carrier lifetimes measured according to temperatures of thermal treatments in accordance with a comparison example and an embodiment of the inventive concepts.

FIG. 10 is a graph showing effective carrier lifetimes measured according to temperatures of thermal treatments in accordance with a comparison example and an embodiment of the inventive concepts.

Referring to FIG. 10, effective carrier lifetimes were measured after the thermal treatments described with reference to FIGS. 6 and 7 were performed. The effective carrier lifetime when performing the thermal treatment in the atmosphere including sulfur according to the embodiment of the inventive concepts is increased compared with the effective carrier lifetime when performing the thermal treatment in the $N_2$ gas atmosphere not including the chalcogen element in accordance with the comparison example. In other word, the thermal treatment is performed in the atmosphere including the chalcogen element to form the negative charge layer, so the lifetime of the carrier is improved to improve the photovoltaic conversion efficiency of the solar cell.

In particular, the lifetime of the carrier is markedly increased when the temperature of thermal treatment is higher than 550 degrees Celsius, but the lifetime of the carrier is reduced again when the temperature of thermal treatment is higher than 700 degrees Celsius. In other word, the thermal treatment is performed using the source including the chalcogen element at the temperature of 550 degrees Celsius to 700 degrees Celsius, and thus, the lifetime of the carrier is increased to improve the photovoltaic conversion efficiency of the solar cell.

Application examples of the solar cell according to embodiments of the inventive concepts will be described hereinafter.

Figure 11:
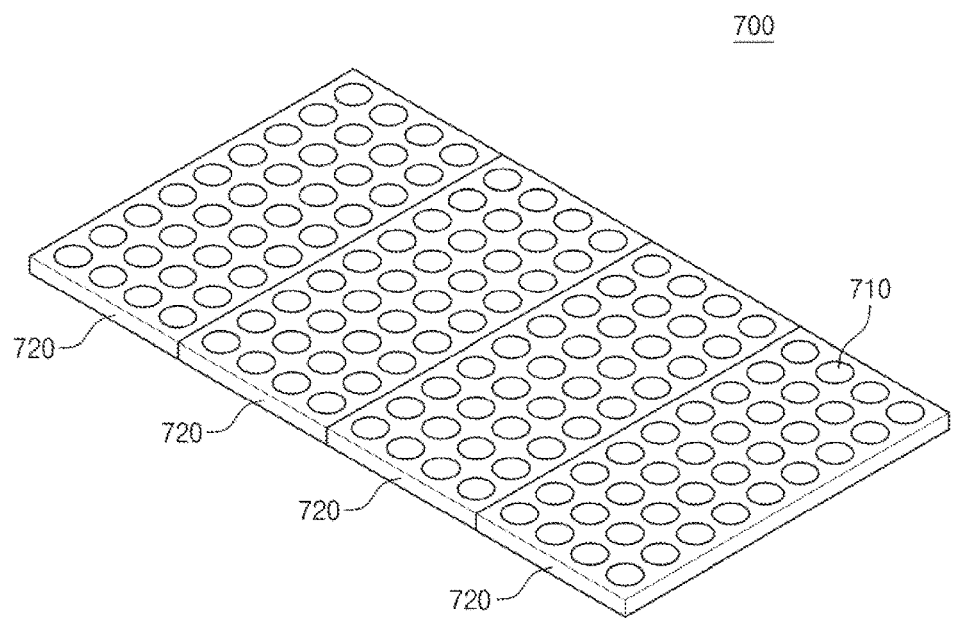
FIG. 11 is a perspective view illustrating a solar cell array using a solar cell according to embodiments of the inventive concepts.

FIG. 11 is a perspective view illustrating a solar cell array using a solar cell according to embodiments of the inventive concepts.

Referring to FIG. 11, a solar cell array 700 may include one or more solar cell modules 720 installed in a main frame (not shown). Each of the solar cell modules 720 may include a plurality of solar cells 710. The solar cell 710 may be the solar cell according to the aforementioned embodiment of the inventive concepts. The solar cell array 700 may be equipped at a predetermined angle toward the south in order to easily receive the light of the sun.

The solar cell module 720 or the solar cell array 700 described above may be equipped on a car, a house, a building, a boat, a light tower, a traffic signal system, a portable device, or other various structures.

Figure 12:
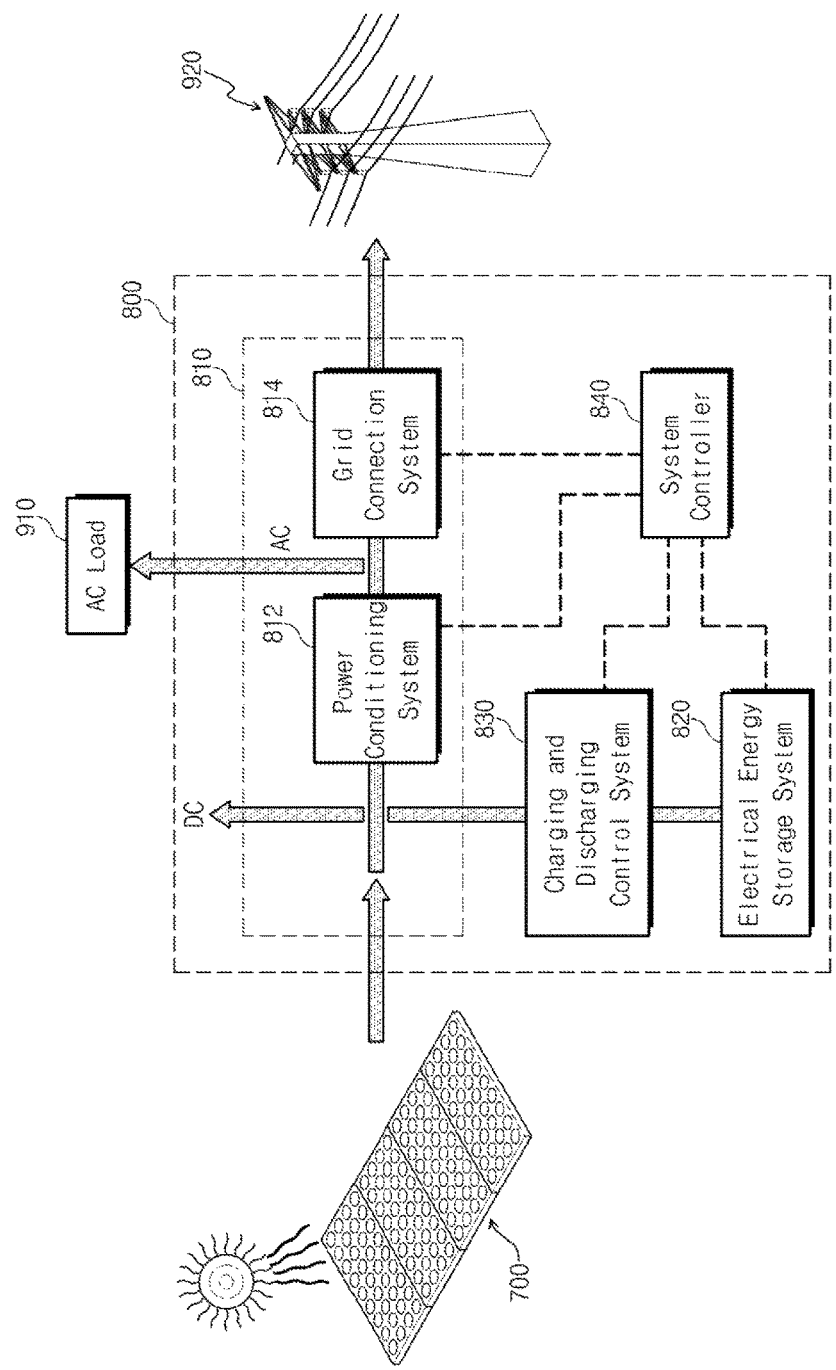
FIG. 12 is a schematic diagram illustrating an example of a solar photovoltaic power generation system using a solar cell according to embodiments of the inventive concepts.

FIG. 12 is a schematic diagram illustrating an example of a solar photovoltaic power generation system using a solar cell according to embodiments of the inventive concepts.

Referring to FIG. 12, the solar photovoltaic power generation system may include the solar cell array 700 and a power control system 800. The power control system 800 may receive electric power from the solar cell array 700 to transmit the electric power to an external system. The power control system 800 may include an output system 810, an electrical energy storage system 820, a charging and discharging control system 830, and a system controller 840. The output system 810 may include a power conditioning system (PCS) 812.

The PCS 812 may correspond to an inverter that converts a direct current (DC) received from the solar cell array 700 into an alternating current (AC). Since the light of the sun does not exist at night and is reduced on cloudy days, generated electric power may be reduced. The electrical energy storage system 820 may store the electric power in order to prevent the generated electric power from being varied according to the weather. The charging and discharging control system 830 may store the electric power received from the solar cell array 700 into the electrical energy storage system 820 or may output the electric power stored in the electrical energy storage system 820 to the output system 810. The system controller 840 may control the output system 810, the electrical energy storage system 820, and the charging and discharging control system 830.

As described above, the converted AC may be supplied to an AC load 910 such as a car and a household. In addition, the output system 810 may further include a grid connection system 814. The grid connection system 814 may be connected to another power system 920 to transmit the electric power to an external system.

The solar cell according to an embodiment of the inventive concepts may include the first semiconductor layer of the first conductivity type, the second semiconductor layer of the second conductivity type disposed on the first semiconductor layer, the anti-reflection layer on the second semiconductor layer, and the negative charge layer between the anti-reflection layer and the second semiconductor layer. Electrons may not be trapped due to the negative charge layer, so the electrons may be easily moved to the electrode and the interface defect density between the second semiconductor layer and the anti-reflection layer may be reduced. As a result, it is possible to realize the high-efficient and high-reliable solar cell having the improved photovoltaic conversion efficiency.

While the inventive concepts have been described with reference to example embodiments, it will be apparent to those skilled in the art that various changes and modifications may be made without departing from the spirits and scopes of the inventive concepts. Therefore, it should be understood that the above embodiments are not limiting, but illustrative. Thus, the scopes of the inventive concepts are to be determined by the broadest permissible interpretation of the following claims and their equivalents, and shall not be restricted or limited by the foregoing description.

What is claimed is:

1. A solar cell comprising:
   a first semiconductor layer of a first conductivity type;
   a second semiconductor layer of a second conductivity type disposed on the first semiconductor layer;
   an anti-reflection layer on the second semiconductor layer; and
   a negative charge layer between the anti-reflection layer and the second semiconductor layer, wherein the negative charge layer consists essentially of aluminum sulfide.

2. The solar cell of claim 1, wherein a thickness of the negative charge layer is smaller than a thickness of the anti-reflection layer.

3. The solar cell of claim 1, wherein the negative charge layer is disposed directly on the second semiconductor layer so as to be in contact with the second semiconductor layer.

4. The solar cell of claim 1, wherein each of the second semiconductor layer, the negative charge layer and the anti-reflection layer has an uneven structure including at least one concave portion and at least one convex portion.

5. The solar cell of claim 1, further comprising: an electrode pattern penetrating the anti-reflection layer so as to be in contact with the negative charge layer.

6. The solar cell of claim 1, wherein both the negative charge layer and the anti-reflection layer comprise aluminum.

7. A method of fabricating a solar cell, the method comprising:
   preparing a first semiconductor layer of a first conductivity type and a second semiconductor layer of a second conductivity type disposed on the first semiconductor layer;
   forming an anti-reflection layer on the second semiconductor layer; and
   after forming the anti-reflection layer, forming a negative charge layer between the second semiconductor layer and the anti-reflection layer;
   wherein the negative charge layer is formed using a plasma treatment that includes providing a source including a chalcogen element to a top surface of the anti-reflection layer.

8. The method of claim 7, wherein the source comprises $H_2S$ gas.

9. The method of claim 7, wherein the top surface of the anti-reflection layer is thermally treated at a temperature between 550 degrees Celsius and 700 degrees Celsius.

10. The method of claim 7, wherein the negative charge layer comprises aluminum sulfide.

11. A method of fabricating a solar cell, the method comprising:
    preparing a first semiconductor layer of a first conductivity type and a second semiconductor layer of a second conductivity type disposed on the first semiconductor layer;
    forming an anti-reflection layer on the second semiconductor layer; and
    after forming the anti-reflection layer, forming a negative charge layer on the second semiconductor layer,
    wherein the negative charge layer is provided between the second semiconductor layer and the anti-reflection layer; and
    wherein the negative charge layer is formed by thermally treating a top surface of the anti-reflection layer using a source including a chalcogen element.

12. The method of claim 11, wherein the top surface of the anti-reflection layer is thermally treated at a temperature of 550 degrees Celsius to 700 degrees Celsius.

13. The method of claim 11, wherein the source comprises $H_2S$ gas.

14. The method of claim 11, wherein the anti-reflection layer and the negative charge layer comprise aluminum.

15. The method of claim 11, wherein the negative charge layer comprises aluminum sulfide.

* * * * *